(12) United States Patent
Smith et al.

(10) Patent No.: US 8,140,175 B2
(45) Date of Patent: Mar. 20, 2012

(54) DATA PROCESSING SYSTEM AND METHOD

(75) Inventors: Colin Smith, Sheffield (GB); Matthew Gilbert, Sheffield (GB)

(73) Assignee: The University of Sheffield, Sheffield (GB)

( * ) Notice: Subject to any disclaimer, the term of this patent is extended or adjusted under 35 U.S.C. 154(b) by 258 days.

(21) Appl. No.: 12/443,713

(22) PCT Filed: Oct. 1, 2007

(86) PCT No.: PCT/GB2007/003710
§ 371 (c)(1),
(2), (4) Date: Mar. 31, 2009

(87) PCT Pub. No.: WO2008/040946
PCT Pub. Date: Apr. 10, 2008

(65) Prior Publication Data
US 2010/0094600 A1      Apr. 15, 2010

(30) Foreign Application Priority Data

Oct. 2, 2006   (GB) .................................. 0619393.2
Oct. 1, 2007   (WO) ................ PCT/GB2007/003710

(51) Int. Cl.
*G06F 19/00* (2011.01)
(52) U.S. Cl. ............................................. 700/98; 703/2
(58) Field of Classification Search .................... 700/95, 700/96, 98, 118; 703/1, 2, 3, 6
See application file for complete search history.

(56) References Cited

U.S. PATENT DOCUMENTS

| | | | | |
|---|---|---|---|---|
| 5,379,227 A * | 1/1995 | Tang et al. | ...................... | 700/98 |
| 5,604,893 A * | 2/1997 | Burnett et al. | ..................... | 703/2 |
| 5,625,575 A * | 4/1997 | Goyal et al. | ....................... | 703/6 |
| 5,963,459 A * | 10/1999 | Burnett et al. | ..................... | 703/5 |
| 6,243,663 B1 * | 6/2001 | Baty et al. | .......................... | 703/2 |
| 6,303,316 B1 * | 10/2001 | Kiel et al. | .......................... | 435/6 |
| 6,330,523 B1 * | 12/2001 | Kacyra et al. | ................. | 702/159 |
| 6,490,528 B2 * | 12/2002 | Cheng et al. | .................... | 702/14 |
| 6,516,274 B2 * | 2/2003 | Cheng et al. | .................... | 702/14 |
| 6,820,043 B2 * | 11/2004 | Mallet et al. | ...................... | 703/2 |
| 6,853,922 B2 * | 2/2005 | Stark | ................................ | 702/14 |
| 6,879,946 B2 * | 4/2005 | Rong et al. | ........................ | 703/2 |
| 6,980,935 B2 * | 12/2005 | Lu et al. | ............................ | 703/1 |
| 7,024,342 B1 * | 4/2006 | Waite et al. | ........................ | 703/6 |
| 7,047,165 B2 * | 5/2006 | Balaven et al. | .................... | 703/2 |
| 7,324,103 B2 * | 1/2008 | Stewart et al. | ................ | 345/420 |
| 7,398,696 B2 * | 7/2008 | Koenemann | .................... | 73/784 |
| 7,565,276 B2 * | 7/2009 | Song et al. | ......................... | 703/2 |
| 7,580,819 B2 * | 8/2009 | De et al. | ............................ | 703/6 |
| 7,657,406 B2 * | 2/2010 | Tolone et al. | ...................... | 703/2 |
| 2001/0044709 A1 * | 11/2001 | Fujimori et al. | ................... | 703/2 |
| 2001/0047245 A1 * | 11/2001 | Cheng et al. | .................... | 702/14 |
| 2002/0007247 A1 * | 1/2002 | Cheng et al. | .................... | 702/17 |
| 2002/0016700 A1 * | 2/2002 | Furusu et al. | ...................... | 703/6 |
| 2002/0032494 A1 * | 3/2002 | Kennon et al. | .................. | 700/98 |
| 2002/0095276 A1 * | 7/2002 | Rong et al. | ........................ | 703/2 |
| 2003/0023383 A1 * | 1/2003 | Stark | ................................ | 702/14 |
| 2003/0097195 A1 * | 5/2003 | Yamrom et al. | ................ | 700/95 |
| 2004/0194051 A1 * | 9/2004 | Croft | ................................ | 716/20 |
| 2005/0253061 A1 * | 11/2005 | Cameron et al. | .............. | 250/287 |

(Continued)

*Primary Examiner* — Albert Decady
*Assistant Examiner* — Anthony Whittington
(74) *Attorney, Agent, or Firm* — Oliff & Berridge, PLC

(57) ABSTRACT

Embodiments of the present invention relate to a system and method for analysing, designing and manufacturing a body to determine potential discontinuities within the body when subjected to an action.

31 Claims, 11 Drawing Sheets

U.S. PATENT DOCUMENTS

2006/0080069 A1* 4/2006 Fujimoto .......................... 703/2
2006/0241921 A1* 10/2006 Willis .............................. 703/2
2006/0259283 A1* 11/2006 Brughmans et al. .............. 703/2

* cited by examiner

| Block length:height aspect ratio | Analytical: $q$ | Numerical: Nodal divisions ($x \times y$) | $q$ | Error% | CPU (s) |
|---|---|---|---|---|---|
| 1 | 2.000 | 26 x 25 | 2.000 | 0.00 | 3 |
| 3.644 | 3.334 | 92 x 25 | 3.335† | 0.03 | 200 |
| 6.718 | 4.894 | 169 x 25 | 4.900† | 0.12 | 676 |

†Aspect ratios of 3.64 and 6.72 were used in the numerical studies.

| Nodal divisions ($x \times y$) | $N_{c0}$ | Error%† | CPU (s) |
|---|---|---|---|
| 16 x 36 | 7.3589 | 1.54 | 5 |
| 32 x 72 | 7.2901 | 0.59 | 82 |
| 64 x 144 | 7.2590 | 0.16 | 2503 |
| 128 x 288 | 7.2473 | - | 57561 |

†Relative to 128 x 288 nodal divisions solution

1200

| Friction angle (°) | % of domain width used by footing | Low nodal density: 48 x 16 divisions | | Medium nodal density: 48 x 16 divisions | | High nodal density: 48 x 16 divisions | |
|---|---|---|---|---|---|---|---|
| | | $N_q$ (error%) | CPU (s) | $N_q$ (error%) | CPU (s) | $N_q$ (error%) | CPU (s) |
| 5 | 18.75 | 1.57068 (0.19) | 8/48† | 1.56873 (0.07) | 157 | 1.56815 (0.03) | 5010 |
| 10 | 16.67 | 2.4802 (0.35) | 10/55† | 2.47497 (0.14) | 206 | 2.47307 (0.07) | 6577 |
| 15 | 14.58 | 3.96232 (0.54) | 13/59† | 3.95088 (0.25) | 290 | 3.94544 (0.11) | 10457 |
| 20 | 12.50 | 6.45128 (0.81) | 15/64† | 6.42593 (0.41) | 338 | 6.40833 (0.14) | 10856 |
| 25 | 10.42 | 10.8038 (1.33) | 15/67† | 10.7147 (0.49) | 343 | 10.6844 (0.21) | 12399 |
| 30 | 8.33 | 18.8034 (2.19) | 15/61† | 18.5083 (0.58) | 326 | 18.6844 (0.28) | 11321 |
| 35 | 6.25 | 34.2685 (2.92) | 8/65† | 33.5977 (0.91) | 252 | 33.4418 (0.44) | 12460 |
| 40 | 4.17 | 66.8119 (4.08) | 11/67† | 65.056 (1.34) | 187 | 64.6419 (0.70) | 6414 |
| 45 | 4.17 | 139.974 (3.78) | 19/68† | 136.974 (1.56) | 480 | 135.830 (0.71) | 25392 |

†CPU time when adaptive nodal connection scheme not employed

DATA PROCESSING SYSTEM AND METHOD

CROSS REFERENCE TO RELATED APPLICATIONS

This is a national phase application of International Application PCT/GB2007/003710, filed Oct. 1, 2007, and claims priority to United Kingdom Patent Application No. 0619393.2 (GB), filed Oct. 2, 2006.

FIELD OF THE INVENTION

The present invention relates to a data processing system and method and, more particularly, to such a system and method for discontinuity identification.

BACKGROUND OF THE INVENTION

Pioneering theoretical developments in the field of plasticity in the middle of the last century led to the development of simple yet practical and powerful analytical tools that were used to rapidly estimate the limit loads of simple bodies and structures. However, engineers increasingly demand more generally applicable methods, which normally require the use of numerical methods rather than analytical methods. Unfortunately, and despite their potential usefulness in practice, relatively few generally applicable numerical methods have to date been explored for this application. Of the methods that have been explored, the finite element method has proved the most popular with researchers over the past few decades as can be appreciated from, for example, Hodge, P. & Belytschko, T. 1968 Numerical methods for the limit analysis of plates. *J App. Mech.* 35 (4), 796-802, Lysmer, J. 1970 Limit analysis of plane problems in soil mechanics. *Journal of the Soil Mechanics and Foundations Division ASCE* 96 (4), 1311-1334; Sloan, S. 1988 Lower bound limit analysis using finite elements and linear programming. *Int. J. Num. Anal. Meth. in Geomech.* 12 (4), 61-77; and Makrodimopoulos, A. & Martin, C. 2006 Lower bound limit analysis of cohesive-frictional materials using second-order cone programming. *Int. J. Num. Meth. in Eng.* 6 (4), 604-634, which are all incorporated herein in their entirety by reference for all purposes. However, at the time of writing finite element limit analysis has still to find widespread usage in engineering practice, with engineers instead being forced to rely either on analytical methods of limited applicability or on potentially cumbersome iterative elastic-plastic analysis methods.

Modern finite element limit analysis formulations, typically, involve discretisation of a body using both solid and interface elements, the latter being placed between solid elements to permit jumps in the stress or strain rate fields. Such formulations may, therefore, be considered as hybrid continuous-discontinuous analysis methods. Suitable finite element shape functions are used to ensure that the internal stresses in the solid elements satisfy specified yield criteria (equilibrium formulation), or that the flow rule is satisfied throughout each solid element (kinematic formulation). The failure surfaces used in limit analysis are generally non-linear, although they may be linearised to permit the problem to be solved using linear programming (LP).

Alternatively, problems involving certain non-linear yield surfaces can be treated using efficient convex programming techniques. Efficient convex programming techniques include, for example, Second Order Cone Programming used by Makrodimopoulos & Martin mentioned above. Unfortunately, the solutions obtained using finite element limit analysis are often highly sensitive to the geometry of the original finite element mesh, particularly in the region of stress or velocity singularities. Although meshes may be tailored to suit the problem in hand this is clearly unsatisfactory since advance knowledge of the mode of response is required. Adaptive mesh refinement schemes can potentially overcome this problem as can be appreciated from, for example, Lyamin, A., Sloan, S., Krabbenhoft, K. & Hjiaj, M. 2005 Lower bound limit analysis with adaptive remeshing. *Int. J. Numer. Meth. Engng.* 63, 1961-1974, which is incorporated herein in its entirety for all purposes. However, the resulting analysis procedure is complex considering the simple rigid-plastic material idealisation involved.

Finite element analysis is traditionally concerned with formulation and solution of a continuum mechanics problem. Alternatively, it is possible to consider a potentially simpler discontinuous problem. This involves directly identifying the discontinuities that form at failure such as, for example, slip-lines that transform a planar continuum into discontinua. However, previous attempts to develop discontinuous limit analysis formulations have been largely unsuccessful, principally because previous formulations have permitted only a severely limited range of possible failure mechanisms to be considered. For example, Munro, J. & Da Fonseca, A. 1978 Yield line method by finite elements and linear programming, *The Structural Engineer* 56B (2), 37-44, which is incorporated herein in its entirety for all purposes, prescribed that discontinuities could only coincide with the boundaries of rigid elements, meaning, for example, that fan zones in failure mechanisms could not easily be identified (unless the mesh was pre-defined to take this form). Modern hybrid continuous-discontinuous finite element limit analysis formulations also prescribe that discontinuities can only coincide with element boundaries, although such formulations partly compensate for this by allowing displacements in the elements themselves.

It is an object of embodiments of the present invention to at least mitigate one or more of the problems of the prior art.

SUMMARY OF INVENTION

Accordingly, a first aspect of embodiments of the present invention provides a data processing method to evaluate displacements at discontinuities within a body; the method comprising the steps of modelling the body as a plurality of n nodes associated with m potential discontinuities, between a selected number of the n nodes, within the body;

determining, from the potential discontinuities, an optimised set of discontinuities that leads to optimisation of an objective function which quantifies the energy dissipation within the body due to displacements at the potential discontinuities in response to a given action; the objective function is expressed in terms of the potential discontinuities and work associated with respective displacements at the potential discontinuities, the objective function being subject to at least one constraint expressing a relationship between the potential discontinuities and respective components of displacements at the nodes associated with the potential discontinuities.

Advantageously, embodiments of the present invention enable a successful discontinuous limit analysis procedure to be realised that can identify a critical arrangement of discontinuities from a wide, preferably near-infinite, number of possibilities.

Other aspects of embodiments of the present invention are described below and claimed in the appended claims.

BRIEF DESCRIPTION OF THE DRAWINGS

Embodiments of the present invention will now be described, by way of example only, with reference to the accompanying drawings in which.

DETAILED DESCRIPTION OF EMBODIMENTS OF THE INVENTION

A Discontinuity Layout Optimisation

Kinematic Formulation

Figure 1A:
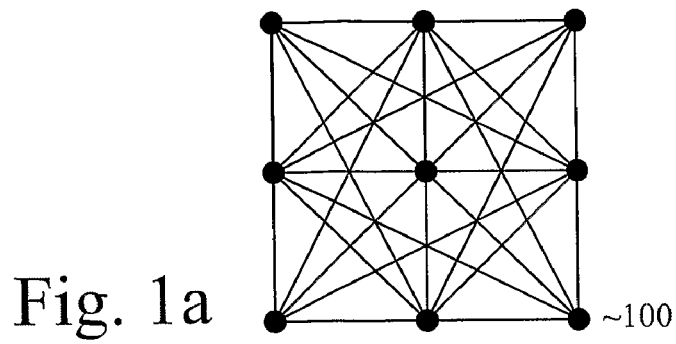
FIG. 1 shows a series of problem domains defined by regularly spaced nodal grids and with discontinuity sets defined by full connectivity of these nodes. The number and nature of the 'equivalent' elements that lie between these discontinuities are thus implicitly illustrated.

The 'kinematic' discontinuity layout optimization formulation for a body discretised using m nodal connections (i.e. discontinuities), n nodes, with η displacements on each discontinuity and π linear yield surface constraints for each discontinuity and a single load case can be defined as follows:

$$\min \lambda f_L^T d = -f_D^T d + g^T p \quad (1a)$$

subject to:

$$Bd = 0 \quad (1b)$$

$$N_p - d = 0 \quad (1c)$$

$$f_L^T d = 1 \quad (1d)$$

$$p \geq 0 \quad (1e)$$

where $f_D$ and $f_L$ are vectors containing respectively specified dead and live loads, d is a vector of displacements on the discontinuities; g is a vector containing the work done for each unit displacement on each discontinuity, B is a suitable compatibility matrix, N is a suitable flow matrix and p is a vector of plastic multipliers. In the present embodiment, the displacements in d and the plastic multipliers in p are the problem variables. If all constraints are linear then linear programming can be used; otherwise suitable non-linear programming solvers can be used. Since d and p both contain terms relating to individual discontinuities, the formulation is thus entirely expressed in terms relating to discontinuity lines only.

It should be noted that herein the term "displacement" is used as shorthand for "displacement rate" and the term "work done" is shorthand for "rate of work done". Other specific terms describing displacements are similarly shorthand for the rate of that displacement.

Figure 1B:
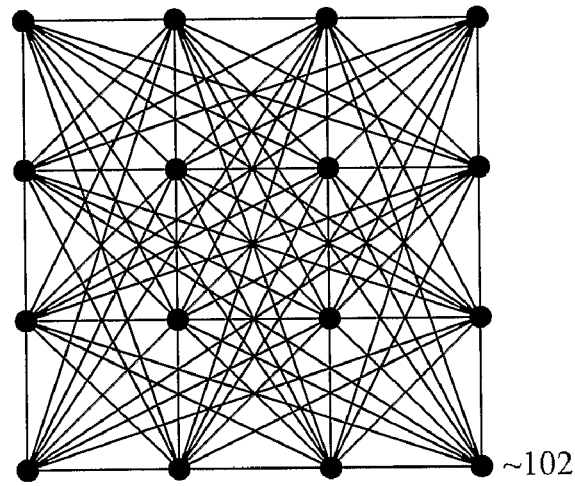
Figure 1C:
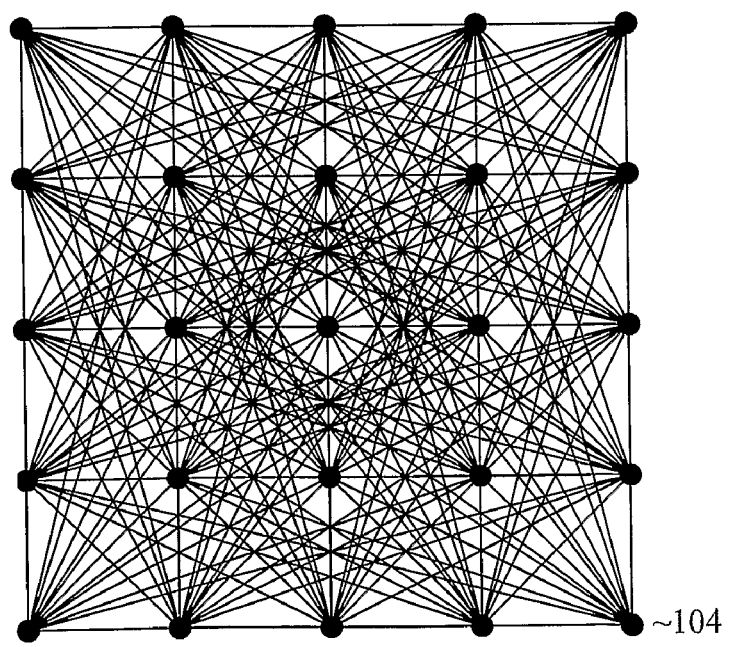

A key advance in embodiments of the present invention is that the problem is described only in terms of nodes and discontinuities connecting those nodes rather than elements or bodies. It can be appreciated that, for the purposes of the embodiments, discontinuities can freely cross each other at any location, which includes non-nodal points as well as nodal points. This then divides the domain into an extremely large range of elements. The potential discontinuities define the search space for the mathematical programming optimisation. It can be appreciated that a potential discontinuity can be any line between any two given nodes. For example in FIG. 1a, if all possible nodal connections are considered, the 3×3 array of nodes 100 contains 36 potential discontinuities (including overlapping discontinuities). These discontinuities can be seen to define 56 polygonal elements, with a total of 92 individual interfaces. A set of such elements can be modelled using prior art approaches. However, an advantage of the embodiments of the present invention is that each element does not need to be explicitly considered, only the discontinuities need to be considered, at considerably reduced computational effort. The effect becomes more significant for larger arrays of nodes, as shown for example in FIG. 1b for a 4×4 regular array 102 or in FIG. 1c for a 5×5 regular array 104. It should be noted that in the current method, because, several 'elements' may share a common discontinuity line with a common displacement vector, then the number of degrees of freedom for their movements is less than if all elements were individually modelled. The gain is still, however, significant. Additionally, the ability to consider potential discontinuities over a wide range of orientations is highly advantageous.

The search or optimisation space for the mathematical programming is thus not limited to considering discontinuities defined by immediately adjacent nodes of a discretised representation of a body, but encompasses, additionally or alternatively, discontinuities defined by lines between non-adjacent nodes of the discretised representation of the body.

The optimal solution to a problem will not typically utilise all m initial defined discontinuities. Solving equation (1a) using mathematical programming, in effect, searches all m potential discontinuities with a view to identifying the subset of all potential discontinuities that optimises equation (1a) for d and p.

It is preferable to discretise a body using of the order of $10^4$ nodes to obtain close approximations of known solutions. One skilled in the art appreciates that some other number of nodes could be used. Still further, preferred embodiments take into account at least one, and preferably both, of the prevailing boundary and loading conditions.

B Illustrative Examples

The generic formulation given in equation (1) can be applied to a wide range of problems. Illustration of the use of the formulation will be given in the context of (a) a planar limit analysis problem in cohesive weightless material, (b) a planar limit analysis problem in cohesive-frictional material possessing self weight, (c) an out-of-plane yield line analysis problem for a reinforced concrete slab. The above examples are not an exhaustive range of applications but serve to show how the method can be applied.

(a) Planar Limit Analysis Problem in Cohesive Weightless Material

Figure 2:
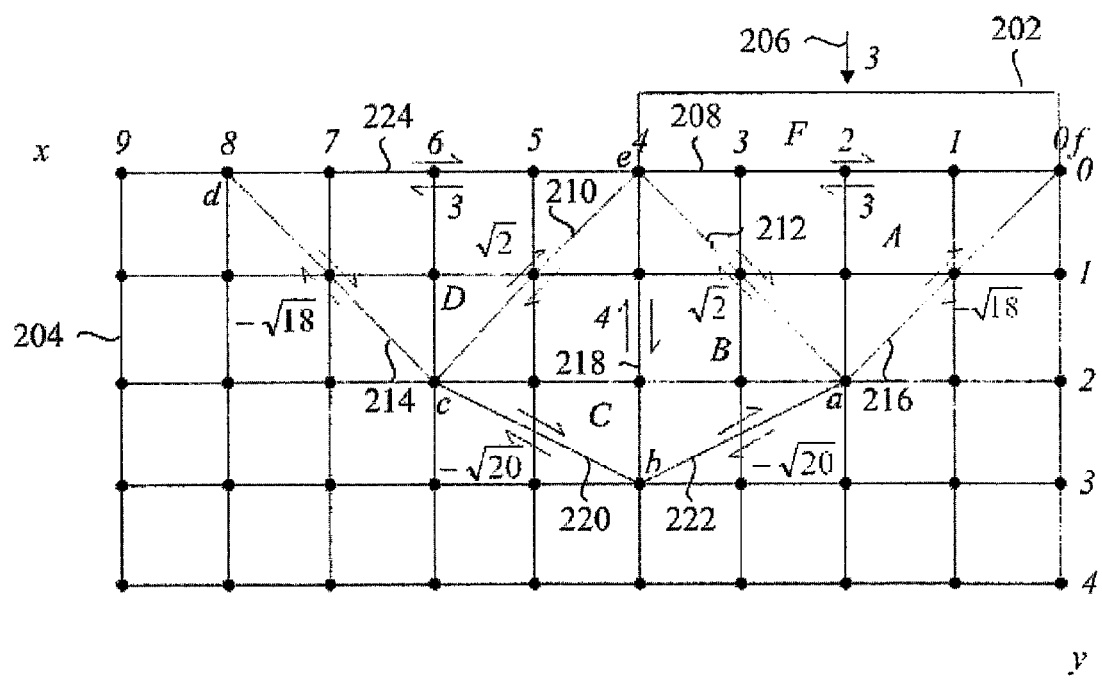
FIG. 2 shows a problem domain identifying discontinuities in a planar body that is subjected to an in-plane load.

FIG. 2 shows a problem domain 200 for a simple example limit analysis problem of the plane strain bearing capacity of a footing 202 on a cohesive weightless medium 204. In this context the discontinuities are slip lines and the displacements d are represented by $d^T = \{s_1, n_1, s_2, n_2 \ldots n_m\}$, where $s_i$ and $n_i$ are the shear and normal displacements on slip-line i (2 displacements per discontinuity). The non-zero terms in $f_L$ are the live load applied through the footing between (0,0) and (4,0) to the medium 204. The dead load $f_D$ is zero in this case, $g^T = \{c_1 l_1, c_1 l_1, c_2 l_2, \ldots c_m l_m\}$, where $l_i$ and $c_i$ are respectively the length and cohesive shear strength of a potential slip-line i. In this formulation the failure mechanism is restricted to a translational mechanism only.

The contribution of each potential slip line to the global compatibility constraint equation (1b) can be written as follows:

$$B_i d_i = u_i \quad (2)$$

where $B_i$, $d_i$, and $u_i$ are respectively the local compatibility matrix and slip-line and nodal displacement vectors. Equation (2) may be expressed in expanded form as:

$$\begin{bmatrix} \alpha_i & -\beta_i \\ \beta_i & \alpha_i \\ -\alpha_i & \beta_i \\ -\beta_i & -\alpha_i \end{bmatrix} \begin{bmatrix} s_i \\ n_i \end{bmatrix} = \begin{bmatrix} u_{Ai}^x \\ u_{Ai}^y \\ u_{Bi}^x \\ u_{Bi}^y \end{bmatrix} \quad (3)$$

where $\alpha_i$ and $\beta_i$ are respectively x-axis and y-axis direction cosines for slip-line i, connecting nodes A and B. For a planar translational mechanism, the nodal displacements have 2 degrees of freedom. For each node j all contributions $u_{j_i}^x$ and $u_{j_i}^y$ due to all slip lines i connecting to that node must each sum to zero.

For this problem, equation (1c) represents the flow rule and is expressed by the following constraint on each slip line i, which ensures no dilation can occur on each slip-line:

$$N_i p_i - d_i = \begin{bmatrix} 1 & -1 \\ 0 & 0 \end{bmatrix} \begin{bmatrix} p_i^1 \\ p_i^2 \end{bmatrix} - \begin{bmatrix} s_i \\ n_i \end{bmatrix} = \begin{bmatrix} 0 \\ 0 \end{bmatrix} \quad (4)$$

Figure 3A:
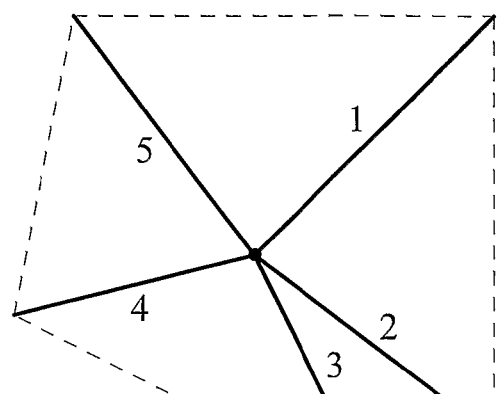
FIG. 3 illustrates compatibility constraints at a node for non-dilating and dilating media.
Figure 3B:
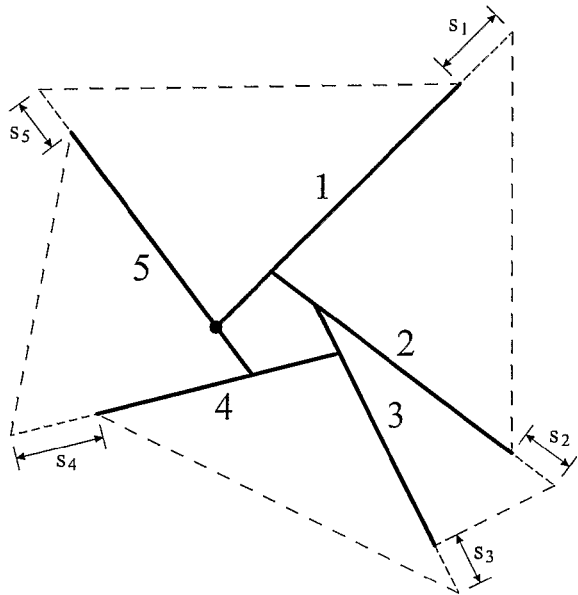

Each plastic multiplier p, which is constrained to be positive by equation (1e), corresponds to a linear yield surface constraint in a dual equilibrium problem formulation (to be described in section G). In this problem there are thus 2 yield constraints. Example element movements which comply with the compatibility (equation (2)) and flow constraints (equation (4)) are illustrated graphically in FIGS. 3(a) and 3(b). It may be appreciated that equation (4) constrains the normal displacements on all slip lines to be zero. Normal displacements could thus be eliminated from most equations. However, normal displacements are retained here for generality and because including them makes specification of normal live or dead loads simpler (i.e using equations (1a) and (1d)).

A slip line mechanism made up of slip-lines 208 to 224 results from solving equation (1) using linear programming with a view to minimising $\lambda f_L^T d$ over d. In fact this is one of several equally optimal mechanisms that can be identified using LP. Any linear combination of these mechanisms represents a valid solution. For clarity this mechanism only is described here. The pairs of opposing arrows represent the relative shear displacements on the relevant slip lines (taken as clockwise positive), $s_i$, having magnitudes corresponding to the adjacent numbers. For example, for the interface separating blocks C and D (or connecting nodes c and e), $s_{ec} = \sqrt{2}$. There is no distinction between $s_{ec}$ and $s_{ce}$. Vector g represents the work done in the system due to the sliding of each interface per unit relative shear displacement. For each sliding interface i in a cohesive weightless medium such as, for example, soil, the work done is given by the shear strength $c_i$ multiplied by the length of the interface $l_i$ multiplied by the shear displacement $s_i$, which equals $|c_i l_i s_i|$ and is independent of the sign of the shear displacement. Thus, the work done per unit shear displacement, $g_{(2i-1)} = g_{2i} = c_i l_i$.

Figure 4:
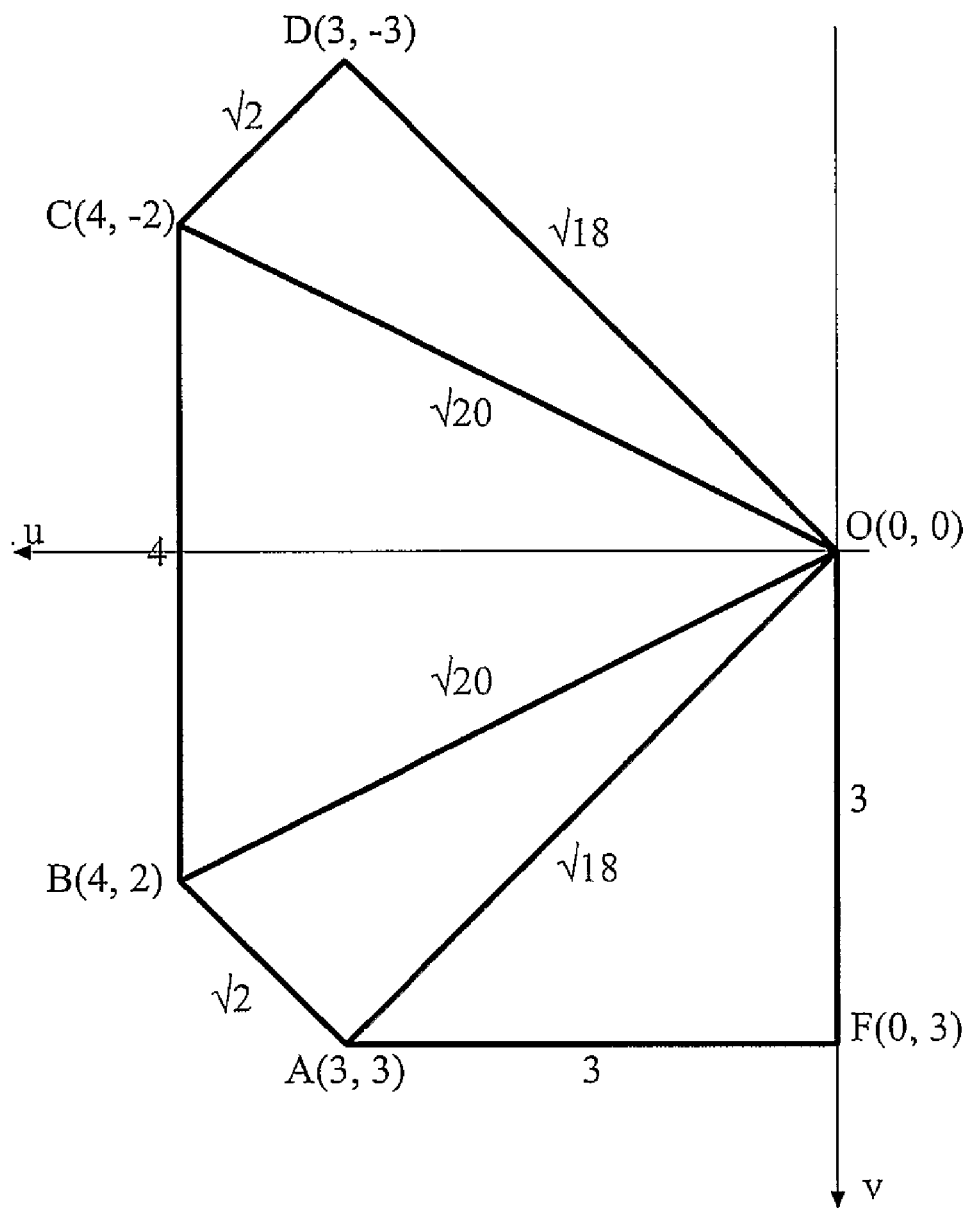
FIG. 4 shows a hodograph corresponding to the problem domain of FIG. 2.

In this example compatibility requires that the relative shear displacement of all interfaces meeting at a node sum to zero. For example, at node b in FIG. 2, the displacements $s_{ab}$, $s_{eb}$, $s_{cb}$ (i.e. displacements on the interfaces between blocks OB, BC, and CO) sum to zero. This is shown in the corresponding hodograph of FIG. 4 where the relevant shear displacements form a closed polygon OBC (in this case a triangle).

For node b, this can be expressed in matrix form as:

$$\begin{bmatrix} \alpha_{ab} & -\beta_{ab} & \alpha_{eb} & -\beta_{eb} & \alpha_{cb} & -\beta_{cb} \\ \beta_{ab} & \alpha_{ab} & \beta_{eb} & \alpha_{eb} & \beta_{cb} & \alpha_{cb} \end{bmatrix} \begin{bmatrix} s_{ab} \\ n_{ab} \\ s_{eb} \\ n_{eb} \\ s_{cb} \\ n_{cb} \end{bmatrix} = \begin{bmatrix} 0 \\ 0 \end{bmatrix} \quad (5)$$

or, substituting numerical terms:

$$\begin{bmatrix} -\frac{2}{\sqrt{5}} & \frac{1}{\sqrt{5}} & 0 & 1 & \frac{2}{\sqrt{5}} & \frac{1}{\sqrt{5}} \\ -\frac{1}{\sqrt{5}} & -\frac{2}{\sqrt{5}} & -1 & 0 & -\frac{1}{\sqrt{5}} & \frac{2}{\sqrt{5}} \end{bmatrix} \begin{bmatrix} -\sqrt{20} \\ 0 \\ 4 \\ 0 \\ -\sqrt{20} \\ 0 \end{bmatrix} = \begin{bmatrix} 0 \\ 0 \end{bmatrix} \quad (6)$$

The linear programming solver finds suitable values of s (and n) that maintain compatibility at all nodes, that is, that are subject to equations such as equation (5) above, while minimising the overall work done which in this case, in the absence of dead loads, is given by $g^T p$. For the displacements given in FIG. 2, the corresponding live load terms in $f_L$ acting on each of the four discontinuities forming ef are $\frac{1}{12}$ thus satisfying equation (1d). For a footing with a smooth base which bears on material possessing a cohesive shear strength of 1 unit, the derived load factor $\lambda$ is 64. The maximum bearing pressure is therefore 64/12=5.333.

In this example, the flow rule in equation (4) ensures that $$s_i = p_i^1 - p_i^2 \quad (7)$$

Since equation (1e) requires $p \geq 0$, $p_i^1$, $p_i^2$ will, providing the corresponding terms in $g_i$ are non-zero, take on the following values:

$$s_i = 0 \Rightarrow p_i^1 = 0, p_i^2 = 0 \quad (8a)$$

$$s_i > 0 \Rightarrow p_i^1 = s_i, p_i^2 = 0 \quad (8b)$$

$$s_i < 0 \Rightarrow p_i^1 = 0, p_i^2 = -s_i \quad (8c)$$

Thus, the work done $g^T p$ is always positive and independent of slip direction and is equal to $|c_i l_i s_i|$ for each slip line i.

(b) Planar Limit Analysis Problem in Cohesive-Frictional Material Possessing Self Weight It will be appreciated by those skilled in the art that the above example applies to a translational failure mechanism and weightless cohesive media. However, there is clearly a need to treat other common constitutive models such as, for example, the Mohr-Coulomb failure criteria, and to be able to include self-weight. For sake of simplicity a translational mechanism is again considered in the embodiment described below.

For cohesive-frictional materials obeying a Mohr Coulomb yield criterion, the associated flow rule stipulates that:

$$n_i = |s_i| \tan \phi_i \quad (9)$$

where $\phi_i$ is the angle of friction (dilation) along slip-line i. In this embodiment, the flow rule may be enforced using the generic equation (1c) in the following form:

$$N_i p_i - d_i = \begin{bmatrix} 1 & -1 \\ \tan\phi_i & \tan\phi_i \end{bmatrix} \begin{bmatrix} p_i^1 \\ p_i^2 \end{bmatrix} - \begin{bmatrix} s_i \\ n_i \end{bmatrix} = \begin{bmatrix} 0 \\ 0 \end{bmatrix} \quad (10)$$

Figure 3C:
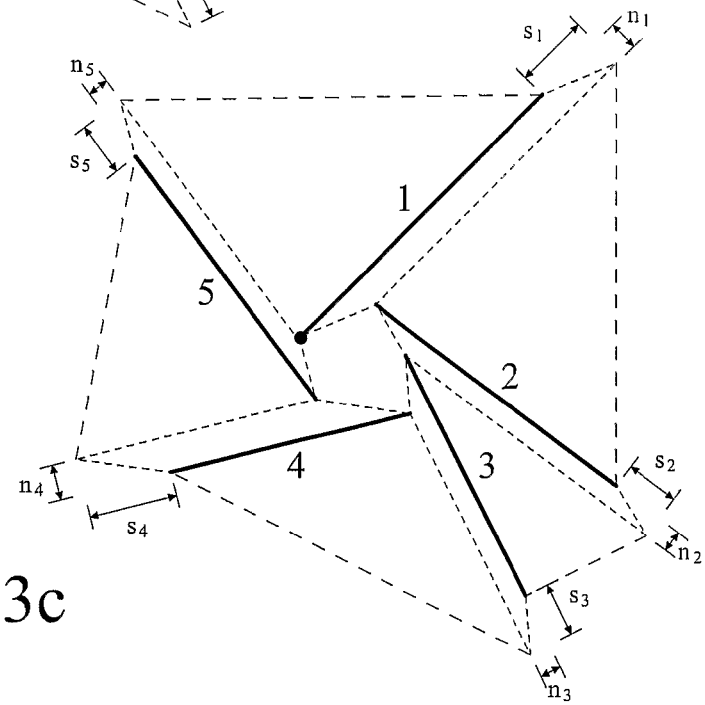

The combined effect of compatibility (equation (2)) and flow constraints (equation (10)) is illustrated graphically in FIG. 3(c), which shows a plurality of slip lines 1 to 5 each having respective amounts of slip, $s_1$ to $s_5$, and respective amounts of dilation, $n_1$ to $n_5$.

It may be noted that for specific problem types it will be possible to recast the generic equation (1) into an alternative form. This may involve a different number of equations and/or a different number of variables. For example in this case, as equation (9) prescribes that the normal displacement $n_i (= n_i^+ - n_i^-)$ is a linear function of the shear displacement (i.e. the normal displacement is not an independent variable), it can be omitted from the linear programming formulation (the variable $n_i^-$ can in any case be omitted since equation (10) permits dilation only when $\tan \phi > 0$). Instead, a combined compatibility and flow constraint may be derived by substituting for $n_i$ in equation as follows:

$$\begin{bmatrix} \alpha_i - \beta_i \tan\phi_i & -\alpha_i - \beta_i \tan\phi_i \\ \beta_i + \alpha_i \tan\phi_i & -\beta_i + \alpha_i \tan\phi_i \\ -\alpha_i + \beta_i \tan\phi_i & \alpha_i + \beta_i \tan\phi_i \\ -\beta_i - \alpha_i \tan\phi_i & \beta_i - \alpha_i \tan\phi_i \end{bmatrix} \begin{bmatrix} s_i^+ \\ s_i^- \end{bmatrix} = \begin{bmatrix} u_{Ai}^x \\ u_{Ai}^y \\ u_{Bi}^x \\ u_{Bi}^y \end{bmatrix} \quad (11)$$

where $s_i = s_i^+ - s_i^-$. One skilled in the art will note that for a purely frictional soil, there is no internal energy dissipation and, hence, for all slip-lines $g_i = 0$. In this case the plastic multipliers in p and separate flow constraint (equation (10)) are not required.

Thus, the operation of the invention is not restricted to the precise form of the generic equation (1), but may take on a different though mathematically equivalent form.

Figure 5A:
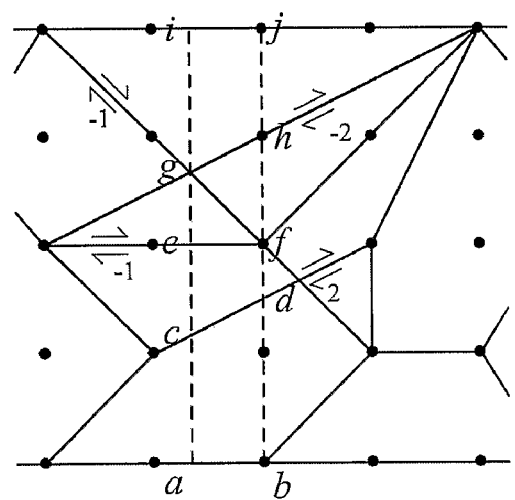
FIG. 5 illustrates how self weight contributions are handled in an in-plane problem.
Figure 5B:
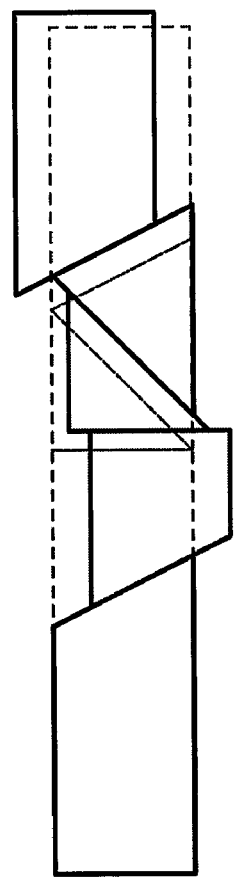

Self weight may be included in the problem as a dead weight term. In this case, the contribution made by slip-line i to the $f_D^T d$ term in equation (1) can be written as follows:

$$f_{Di}^T d_i = [-W_i \beta_i \quad -W_i \alpha_i] \begin{bmatrix} s_i \\ n_i \end{bmatrix} \quad (12)$$

where $W_i$ is the total weight of material lying vertically above slip-line i. The action of this equation is illustrated in FIG. 5a and FIG. 5b. Consider any vertical strip of the problem domain that does not contain any nodes or cross-overs such as aijb, and further consider that only slip line cd is active (i.e. only displacements along cd are non-zero). It can be seen that the vertical component of any movement on slip-line cd will result in work done against gravity equal to the mass of area cijd multiplied by the vertical movement. Now if slip-line ef is now also considered to be active, then area eijf will now have an additional vertical movement relative to that computed previously for area cijd. This may simply be accounted for by adding an additional work term equal to the mass of area eijf multiplied by the relative vertical movement across discontinuity ef. The same arguments may be used in turn for discontinuities gf and gh. These work terms are easily described in terms of the relative shear and normal displacements n and s.

Now while this has been argued for one vertical strip of material, it will be seen that it is straightforward to divide the entire domain into adjacent strips none of which contain any nodes or crossovers i.e. all nodes and crossovers occur on the edge of strips (e.g. g in FIG. 5a).

Since the same argument applies for any given slip-line passing through each strip, it may be readily seen that the net contribution to the work done by that discontinuity is simply the mass of material vertically above that line multiplied by the relative vertical displacement across that line, as expressed by equation (12).

(c) Out-of-Plane Yield Line Analysis Problem for a Reinforced Concrete Slab

Consider a reinforced concrete slab subject to a uniform out-of-plane live pressure load. In terms of the generic equation (1), in this context the discontinuities are yield lines and the displacements d are represented by $d^T = \{\theta_1, \theta_2, \theta_3 \ldots \theta_m\}$, where $\theta_i$ are the relative rotations on interface i (1 displacement per discontinuity). Coefficients in $f_L$ are governed by the distribution of live load. The dead load $f_D$ is zero in this case (taking the slab self weight as negligible). $g^T = \{m_1^P l_1, m_1^P l_1, m_2^P l_2, \ldots m_m^P l_m\}$, where $l_i$ and $m_i^P$ are respectively the length and plastic moment of resistance at a potential yield line i. The rotations along the yield-lines in d and the plastic multipliers in p are the linear programming variables.

Figure 6:
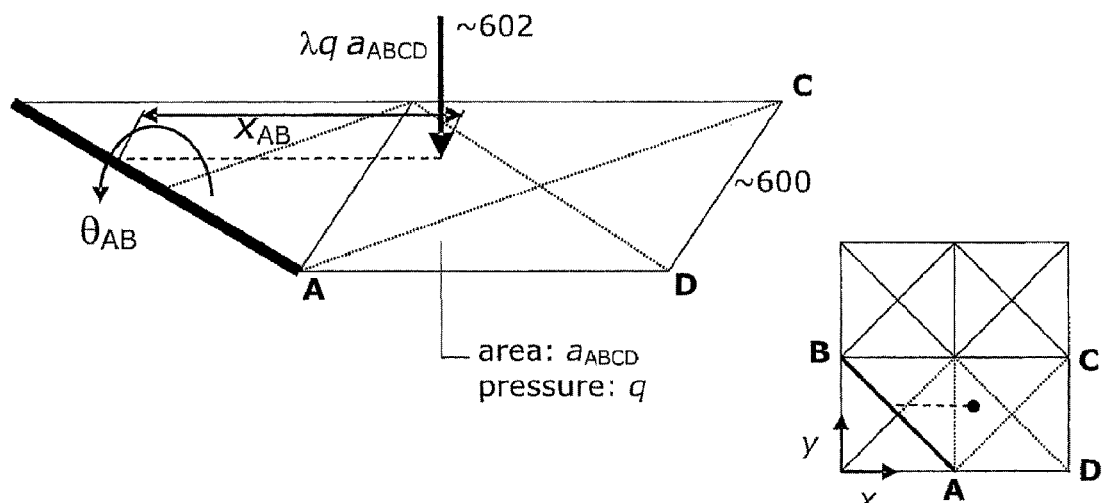
FIG. 6 shows how live load contributions are handled in an out-of-plane problem.

To determine suitable coefficients for inclusion in $f_L$, consider the external work done by the live loads lying in a strip to the right of a yield line i connecting two nodes, A and B, when there is rotation $\theta_i$ at the yield line. In this case, the external work done resulting from the rotation can be written as:

$$\lambda f_{Li}^T d_i = \lambda m_i^{ext} \beta_i \theta_i \quad (13)$$

where $m_i^{ext}$ is the moment caused by the presence of the specified unfactored external live loading and $\beta_i$ is a direction cosine. Using the notation given in FIG. 6, accounting for the presence of a live load to the right of potential yield line AB, $m_i^{ext}$ can alternatively be written in expanded form for the case of uniform pressure loading as:

$$m_i^{ext} = x_i q a_i \quad (14)$$

where q is the intensity of the unfactored pressure loading applied to an area, $a_i = a_{ABCD}$ and where $x_i = x_{AB}$ This approach to dealing with live load here is analogous to that for dealing with self weight in the planar limit analysis problem. The approach is generic to all problems and is a key aspect of the invention when body forces, distributed loads or other comparable actions are to be handled, allowing the analysis to be formulated in terms of discontinuities rather than elements.

Coefficients for inclusion in $f_L$ can now be derived using equations (13) and (14) (i.e. $f_{Li} = m_i^{ext}\beta_i = x_i q a_i \beta_i$), which account for the effects of external loads to the right of a given yield-line (note that as compatibility conditions are already enforced, it is only necessary to work parallel to one Cartesian co-ordinate axis, in this case the x direction).

The flow rule is formulated as follows:

$$N_i p_i - d_i = \begin{bmatrix} 1 & -1 \end{bmatrix} \begin{bmatrix} p_i^1 \\ p_i^2 \end{bmatrix} - [\theta_i] = [0] \quad (15)$$

This ensures that $\theta_i = p_i^1 - p_i^2$ and that plastic work done at the hinges is always positive.

Consider a fixed square slab that is subjected to a uniform out-of-plane pressure loading. The objective is to compute the value of the load factor applied to this pressure loading which will lead to failure. If this problem is discretised using only 4 nodes at the corners of a square ABCD (bottom left=A, top left=B, bottom right=C, top right=D) and 6 potential yield lines (the edges of the square and the 2 diagonals) the problem matrices and vectors are sufficiently small to be written out in full. Here it is assumed that the slab has unit side length, is subject to unit out-of-plane applied pressure load and possesses unit plastic moment of resistance per unit length.

$$\min \lambda f_L^T d = -f_D^T d + g_P^T \equiv \quad (16)$$

$$\min g^T p = \begin{bmatrix} 1 & 1 & 1 & 1 & \sqrt{2} & \sqrt{2} & \sqrt{2} & \sqrt{2} & 1 & 1 & 1 & 1 \end{bmatrix} \begin{bmatrix} p_{AB}^1 \\ p_{AB}^2 \\ p_{AC}^1 \\ p_{AC}^2 \\ p_{AD}^1 \\ p_{AD}^2 \\ p_{BC}^1 \\ p_{BC}^2 \\ p_{BD}^1 \\ p_{BD}^2 \\ p_{CD}^1 \\ p_{CD}^2 \end{bmatrix}$$

subject to:

$$Bd = \begin{bmatrix} 1 & \frac{1}{\sqrt{2}} & & & & \\ 1 & & \frac{1}{\sqrt{2}} & & & \\ & & \frac{1}{\sqrt{2}} & 1 & & \\ -1 & & \frac{1}{\sqrt{2}} & & & \\ & -1 & & & \frac{1}{\sqrt{2}} & \\ & & & & \frac{1}{\sqrt{2}} & 1 \\ & & \frac{1}{\sqrt{2}} & & & -1 \\ & & \frac{1}{\sqrt{2}} & & & -1 \end{bmatrix} \begin{bmatrix} \theta_{AB} \\ \theta_{AC} \\ \theta_{AD} \\ \theta_{BC} \\ \theta_{BD} \\ \theta_{CD} \end{bmatrix} = \begin{bmatrix} 0 \\ 0 \\ 0 \\ 0 \\ 0 \\ 0 \end{bmatrix} \quad (17)$$

$$Np - d = \begin{bmatrix} 1 & -1 & & & & & & & & & & \\ & & 1 & -1 & & & & & & & & \\ & & & & 1 & -1 & & & & & & \\ & & & & & & 1 & -1 & & & & \\ & & & & & & & & 1 & -1 & & \\ & & & & & & & & & & 1 & -1 \end{bmatrix} \begin{bmatrix} p_{AB}^1 \\ p_{AB}^2 \\ p_{AC}^1 \\ p_{AC}^2 \\ p_{AD}^1 \\ p_{AD}^2 \\ p_{BC}^1 \\ p_{BC}^2 \\ p_{BD}^1 \\ p_{BD}^2 \\ p_{CD}^1 \\ p_{CD}^2 \end{bmatrix} - \begin{bmatrix} \theta_{AB} \\ \theta_{AC} \\ \theta_{AD} \\ \theta_{BC} \\ \theta_{BD} \\ \theta_{CD} \end{bmatrix} = \begin{bmatrix} 0 \\ 0 \\ 0 \\ 0 \\ 0 \\ 0 \end{bmatrix} \quad (18)$$

$$f_L^T d = \begin{bmatrix} \frac{1}{2} & 0 & \frac{1}{6\sqrt{2}} & \frac{1}{6\sqrt{2}} & 0 & 0 \end{bmatrix} \begin{bmatrix} \theta_{AB} \\ \theta_{AC} \\ \theta_{AD} \\ \theta_{BC} \\ \theta_{BD} \\ \theta_{CD} \end{bmatrix} = 1 \quad (19)$$

$$p \geq 0 \quad (20)$$

Once solved, the resulting load factor, $\lambda$, for this problem is 48. Other methods can of course identify the same value, but the novel aspect here is that the method works despite the fact that no node has been added at the centre of the slab, which is not the case with, for example, the Munro & Da Fonseca (1978) method.

C Advantage Over Prior Art

An advantage of embodiments of the present invention is that the problem is formulated in terms of discontinuities rather than elements and the critical layouts of discontinuities identified can comprise any number of discrete discontinuities that intersect (crossover) at locations other than nodes. Whilst equilibrium and compatibility respectively are not explicitly checked at crossover points, these are implicitly satisfied. A discontinuity that crosses over others at some point X may instead be considered as two separate discontinuities that meet at X. Since these discontinuities share the same displacements, they simply cancel each other out in the compatibility constraint equations. The sum of the energy dissipation in the two separate discontinuities will be identically equal to the energy dissipation in the original discontinuity. Therefore, solutions containing crossover are perfectly valid. However, this is not to say that explicit addition of a node at crossover points would not lead to the generation of a more optimal solution. In the case of limit analysis problems, crossover can be considered to be particularly important as it effectively allows the domain to be divided into an extremely large number of potential elements, considerably more than when a conventional finite element mesh is used.

D Heterogeneities

Problems containing distinct zones that might have differing values of, for example, unit weight, cohesion, and angle of friction can be treated. In the case of frictional media, all potential inter-zone slip-lines, that is, discontinuities, should use the highest angle of friction encountered to maintain the upper bound status of the solution. Arbitrarily varying cohesion and self-weight can be treated by respectively computing the total cohesive resistance and total weight of soil overlying a given potential slip-line.

E Boundary Conditions

Boundary and external applied loading conditions may be implemented in a variety of ways to suit the particular class of problem. Examples are given here for the case of a planar slip-line analysis problem in cohesive frictional materials.

It is most convenient to define boundaries by simply adjusting the properties of boundary sliplines. For sake of simplicity it is assumed here that potential slip-lines spanning multiple nodes on boundaries are not present.
(i) Free Boundary (Incl. Boundary Subject to an Applied Load)
This may be achieved by setting each potential slip-line i lying on a free boundary to have zero cohesion $c_i$ and also not applying flow rule constraint equation (10), thereby leaving $n_i$ and $s_i$ unconstrained.
(ii) Fixed Boundary
This is the default boundary condition, which requires no special treatment (i.e. the associated cohesion c and angle of friction $\phi$ values of a potential slip-line lying on such a boundary should be the same as those in non-boundary slip-lines, and flow rule constraint equation (10) imposed as usual).
(iii) Line of Symmetry
This may be achieved by setting all potential slip-lines lying on the line of symmetry to have zero cohesion c and zero angle of friction $\phi$. The latter condition effectively constrains the normal displacement $n_i$ of slip-line i to be zero according to equation (10).
(iv) Rigid Loading Plate at Boundary
If a rigid loading plate is present then additional constraints should be included to equalise the imposed displacements (e.g. if the applied load is applied normal to discontinuities joining nodes A, B, C, and D which lie on a straight line then the following constraints should be added: $n_{AB}=n_{BC}=n_{CD}$).

F Solution of Very Large Problems

The above embodiments are particularly suitable for implementing on current personal computers to solve, relatively rapidly, problems comprising of the order of several hundred nodes. The resulting accuracy may be sufficient for many engineering purposes.

However, to obtain more accurate results and to enable problems containing perhaps tens of thousands of nodes to be solved, a modified embodiment employing adaptive addition of nodal connections (discontinuities) can be realised. This is because the number of potential connections, and, hence, the number of variables, rises dramatically with the number of nodes, n. In fact the total number of possible connections can be shown to be n(n−1)/2. Therefore, for a problem involving, for example, 10,000 nodes, there will be approximately 50 million potential connections (discontinuities), and a correspondingly large number of variables. Such a large problem cannot be solved directly using current generation personal computers and solvers. Hence, it is not generally feasible to make all connections at the outset. Accordingly, an embodiment can be realised that uses minimal initial connectivity and that adds further connections as required as part of an iterative scheme.

G Discontinuity Layout Optimisation

Equilibrium Formulation

Central to embodiments employing or implementing such adaptive addition of nodes is consideration of the dual equilibrium problem formulation, which will now be described.

The generic dual equilibrium formulation may be stated as follows:

$$\max \lambda \tag{21a}$$

subject to $$B^T t + \lambda f_L - q = -f_D \tag{21b}$$

$$N^T q \leq g \tag{21c}$$

where t are equivalent internal nodal actions at node j (j=1 ... n), and where q is a vector of actions acting on discontinuities. The problem variables are, therefore, t and q and the live load factor $\lambda$. The objective is, therefore, to maximise the applied load factor, $\lambda$.

Description of the use of the formulation will be given in the context of a planar limit analysis problem in cohesive-frictional material possessing self weight. In this case, $t^T=\{t_1^x, t_1^y, t_2^x, t_2^y, \ldots, t_n^x, t_n^y\}$ and where $t_j^x$ and $t_j^y$ are the x and y direction equivalent internal nodal forces acting at node j (j=1 ... n), and where q is a vector of shear and normal forces acting at discontinuities, i.e. $q^T=\{S_1, N_1, S_2, N_2, \ldots N_m\}$, where $S_i$ and $N_i$ represent respectively the shear and normal force acting on slip line i (i=1 ... m). The problem variables are therefore $t_j^x$, $t_j^y$, $S_i$, $N_i$ and the live load factor $\lambda$.

The required equilibrium constraint for this embodiment can alternatively be written for each potential slip-line i as follows:

$$B_i^T t_i + \lambda f_{Li} - q_i = -f_{Di} \tag{22}$$

or, in expanded form for a weightless cohesive-frictional material, using the form of equation (3), as $$\begin{bmatrix} \alpha_i & \beta_i & -\alpha_i & -\beta_i \\ -\beta_i & \alpha_i & \beta_i & -\alpha_i \end{bmatrix} \begin{bmatrix} t_A^x \\ t_A^y \\ t_B^x \\ t_B^y \end{bmatrix} + \lambda \begin{bmatrix} f_{Li}^s \\ f_{Li}^n \end{bmatrix} - \begin{bmatrix} S_i \\ N_i \end{bmatrix} = -\begin{bmatrix} f_{Di}^s \\ f_{Di}^n \end{bmatrix} \quad (23)$$

The required yield constraint can also be written for a potential slip line i as follows:

$$N_i^T q_i \leq g_i \quad (24)$$

or in expanded form as:

$$\begin{bmatrix} 1 & \tan\phi_i \\ -1 & \tan\phi_i \end{bmatrix} \begin{bmatrix} S_i \\ N_i \end{bmatrix} \leq \begin{bmatrix} c_i l_i \\ c_i l_i \end{bmatrix} \quad (25)$$

Figure 7:
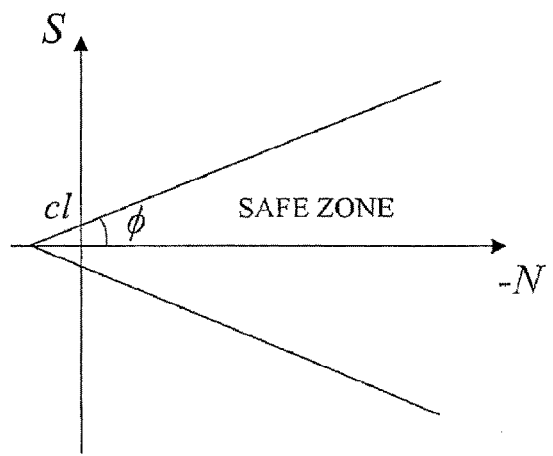
FIG. 7 illustrates a Mohr-Coulomb yield condition prescribed by two lines.

This is illustrated in FIG. 7 and clearly describes the familiar Mohr-Coulomb yield condition (though note that a tensile force is here taken as positive). It will be appreciated by one skilled in the art that the shape of the yield-condition or safety zone shown in FIG. 7 is merely one example. Other embodiments can be realised in which the safety zone has a shape other than as depicted in FIG. 7.

The objective is, therefore, to maximise the applied load factor, $\lambda$, while ensuring that the yield condition is not violated along any potential slip-line.

Duality principles mean that values for $t_j^x$, $t_j^y$, $S_i$, $N_i$ are available even if the primal problem is actually formulated and solved. However, it should be noted that the parameters $S_i$ and $N_i$ are free to take on arbitrary, though constrained, values except in yielding regions, that is, these may be interpreted as normal and shear stress resultants everywhere, but are only exactly so in yielding regions.

H Adaptive Nodal Connection Procedure

It has already been mentioned that when large numbers of nodes are specified it may be too computationally expensive to solve the full-connectivity problem directly. Therefore, embodiments can be realised in which nodes of a discretised body are only partially connected. For example, nodes may only be connected to neighbouring nodes within a maximum distance such as, for example, nodes may be connected only to their nearest neighbours, that is, their immediately adjacent neighbours. Alternatively, embodiments can be realised in which nodes are connected to all other nodes that lie within a specified distance of the current node and/or at a given relative orientation. When solving such an embodiment, as the range of failure mechanism geometries that can be identified will be severely limited, clearly this solution will be likely to significantly over-estimate the true collapse load factor. What is required at this stage is an embodiment comprising a means of identifying which, additional nodal connections or discontinuities could be added to the optimisation problem with a view to improving the solution.

Accordingly, embodiments utilise the fact that the required dual constraint for a given discontinuity i present in the initial problem, as defined by equation (21c), can also be checked for all lines not present in the initial problem ie for lines between nodes that are not initially directly connected. Therefore, any nodal connection line not explicitly modelled as a discontinuity in the initial problem that violates this constraint becomes a candidate discontinuity line for admission to an expanded problem at the next iteration. In mathematical programming terminology, this embodiment would be referred to as a column generation embodiment when variables are added to the primal kinematic problem or a cut generation embodiment when constraints are added to the dual equilibrium problem.

In order to use equation (21c) for a nodal connection line not present in the initial problem, the actions q acting on this discontinuity must be known. While these are not directly available, since the discontinuity was not explicitly modelled in the initial problem, they may be simply derived from the internal nodal actions t that are directly available for the nodes defining the extent of the discontinuity, using a rearranged form of equation (21b):

$$q_i = B_i^T t_i + \lambda f_{Li} + f_{Di} \quad (26)$$

Or in the context of the planar limit analysis problem involving cohesive-frictional material possessing self weight discussed in the previous section:

$$\begin{bmatrix} S_i \\ N_i \end{bmatrix} = \begin{bmatrix} \alpha_i & \beta_i & -\alpha_i & -\beta_i \\ -\beta_i & \alpha_i & \beta_i & -\alpha_i \end{bmatrix} \begin{bmatrix} t_A^x \\ t_A^y \\ t_B^x \\ t_B^y \end{bmatrix} + \lambda \begin{bmatrix} f_{Li}^s \\ f_{Li}^n \end{bmatrix} + \begin{bmatrix} f_{Di}^s \\ f_{Di}^n \end{bmatrix} \quad (27)$$

In preferred embodiments, however, for at least improved and, preferably, maximum, efficiency, the number of discontinuities added at a given iteration is preferably limited to prevent the problem size from increasing too rapidly. Embodiments can, therefore, be realised by identifying and then adding only the potential discontinuities where the dual constraint is most violated.

The iterative adaptive nodal connection procedure proceeds until no potential grid-connection violates the dual constraint expressed in equation (21c), which means that the final solution obtained must also represent a globally improved, and, a globally optimal, solution for the grid with fully connectivity problem.

I Case Study Problems

To verify the accuracy of the solutions obtainable using the procedure, it will now be applied to a range of plane strain metal forming and geotechnical engineering problems, for some of which known analytical solutions already exist. The problems chosen all have pronounced singularities that can create difficulties when using other numerical solution methods.

To obtain the solutions a 2.4 GHz AMD Opteron PC equipped with 4 Gb of memory and running 64-bit Scientific Linux was employed. The Mosek (version 4.0) commercially available interior point LP optimiser that uses the homogeneous and self-dual algorithm was used, which is available from Mosek 2006 *The MOSEK optimization tools manual*. http://www.mosek.com, version 4.0 (revision 35) edn, Mosek ApS. The problem was initially passed to the optimiser in memory, using the supplied subroutine library. Subsequently, it was only necessary to pass changes to the current problem to the optimiser rather than the entire revised problem. The presolve feature of the optimiser was enabled and default tolerances were used. Although the adaptive nodal connection procedure is amenable to parallelization, and a parallel version of the Mosek optimiser is available, a single processor was used for all computations.

Unless stated otherwise, the adaptive nodal connection scheme was used to solve all problems. For the class of planar limit analysis problems involving purely cohesive media (ie using the Tresca failure criterion), pairs of nodes not more than $\sqrt{2}$ apart were connected (assuming unit spacing of nodes in the x and y directions). However, for problems involving frictional media (ie using the Mohr-Coulomb failure criterion) it was found that solutions could be obtained more quickly when the maximum connection distance was increased to $\sqrt{5}$. In fact, when the angle of friction reached or exceeded 45° an initial solution could not otherwise be obtained for the bearing capacity problem, due to volumetric locking. It was also specified that not more than 5% of the number of connections present in the initial minimal connectivity problem could be added at each iteration. However, one skilled in the art appreciates that some other percentage of the number of connections can be used as an alternative to 5%. Still further, the percentage does not need to remain fixed. The number of connections added may vary dynamically. Even though changes to the LP problem at each iteration might be relatively modest, with the interior point optimiser used it was not possible to use the solution from a previous iteration as a starting point for the next optimisation (ie it was not possible to perform a 'warm start').

Quoted CPU times include the time required to make all connections between the nodes and to set up and solve the LP problem(s). When the adaptive nodal connection scheme was used, the CPU times quoted also include the total time required to identify candidate connections for admission at the next iteration.

Finally, it should be noted that uniformly spaced nodes have been used for all problems studied. This contrasts with the usual practice of those skilled in the art of developing rigid-plastic finite element techniques, who have tended to use highly non-uniform meshes painstakingly tailored to suit the particular problem in hand and that may give a false impression of the likely accuracy of the method when initially applied to a new problem.

The use of uniformly spaced nodes means that overlapping connections may easily be filtered out by checking that the greatest common divisor of $\Delta x$ and $\Delta y$ does not exceed unity (where $\Delta x=|x_A-x_B|$, $\Delta y=|y_A-y_B|$, and where $(x_A, y_A)$ and $(x_B, y_B)$ are the co-ordinates of nodes A and B which are potentially to be connected, also assuming unit spacing of nodes in the x and y directions).

(a) Metal Block Compressed Between Perfectly Rough Rigid Platens

Consider a rectangular metal block compressed between two parallel platens. Suppose that the platens are sufficiently rough to ensure that any slip at the platen-block interface occurs only when the shear stress reaches the prescribed cohesion. Chakrabarty, J. 1991, The analytical solution of some boundary value problems in-plane plastic strain. *Int. J. Mech. Sci.* 33, 89-99 and Chakrabarty, J. 2006 *Theory of plasticity*, 3rd edn. Oxford: Butterworth-Heinemann, which are both incorporated herein in their entirety for all purposes, has previously derived analytical solutions for this problem.

Figures 8, 9, 10:
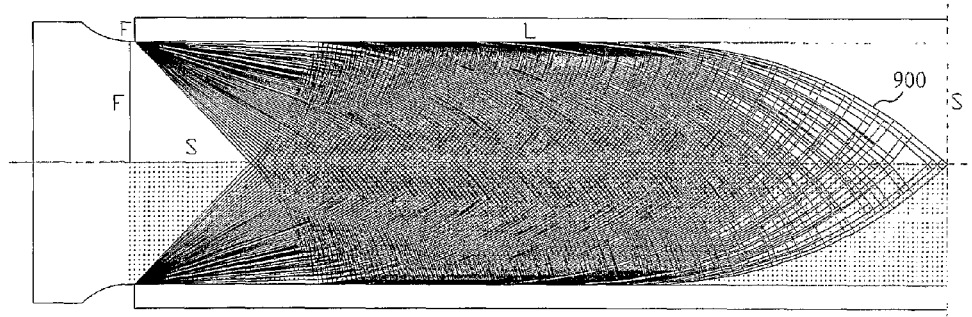
FIG. 8 illustrates a table of variation in failure pressure factors for a metal block compressed between perfectly rough rigid platens.
FIG. 9 shows predicted slip-lines within a metal block compressed between perfectly rough rigid platens.
FIG. 10 illustrates a table of variation in breakout factors for the vertical pullout of a horizontal anchor in a clay soil.

Taking advantage of symmetry, only a quarter of the block needs to be modelled (lines of symmetry were here defined along the top and right hand edges of a rectangular domain). Solutions for block width:height ratios of 2.0, 3.64 and 6.72 are given in table 800 of FIG. 8. The accuracy of the method is clearly demonstrated when results are compared with published values in the literature also given in table 800. The boundary conditions and optimal layout of discontinuities 900 for the 6.72 aspect ratio case is shown in FIG. 9 (here the optimal layout of discontinuities is reflected about the horizontal line of symmetry to give a visual representation of the half block solution). The rigid zones near the centreline are clearly evident, showing the ability of the method to clearly distinguish between rigid and yielding zones. Note that for the sake of clarity only discontinuities with slip displacements $|s_t|>0.00001$ have been plotted in the figure. Also note that the nodes were extended 1 division beyond the edge of the platen to model the influence of the remaining rigid block material. It is clear from the results for this problem that close approximations of exact analytical solutions (<0.15% error) can be obtained reasonably rapidly (<700 seconds).

(b) Embedded Anchor in Clay Soil Problem

Consider the problem of a horizontal anchor embedded in homogeneous weightless clay. The goal is, typically, to determine the maximum pullout force for various embedment ratios (anchor depth/breadth). Currently, there appear to be no exact analytical solutions to this problem, although numerical upper and lower bound solutions have been made available as can be appreciated from, for example, Merifield, R., Sloan, S. & Yu, H. 2001 Stability of plate anchors in undrained clay. *Geotechnique* 51 (2), 141-153, which is incorporated herein in its entirety by reference for all purposes.

It is convenient to express results in terms of a dimensionless breakout factor $N_{co}$ where the ultimate pullout force $Q_u$ in a weightless cohesive soil is given by $Q_u=N_{co}c_uB$ where B is the plate width and $c_u$ the undrained shear strength of the soil.

Figure 11:
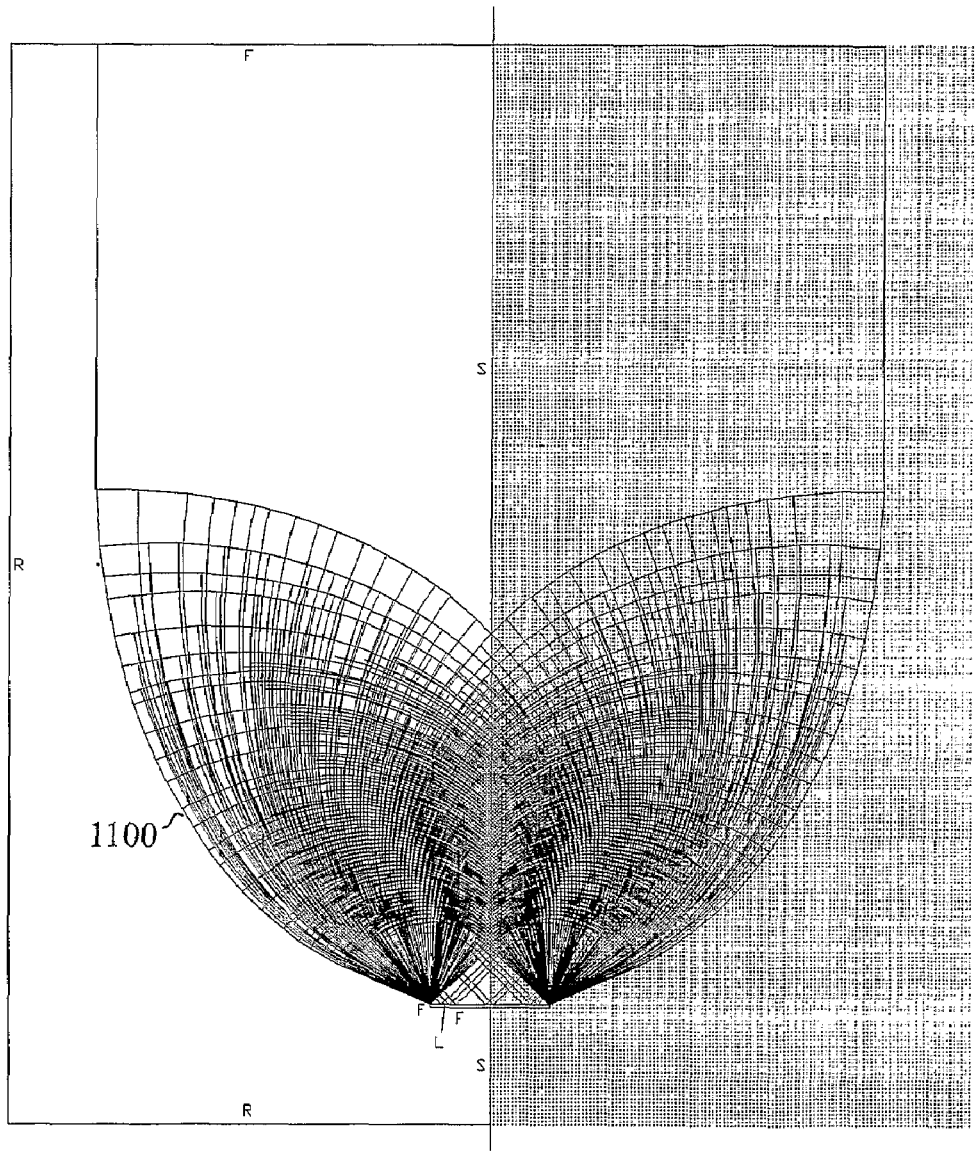
FIG. 11 depicts predicted discontinuities arising within a clay soil due to pullout of an anchor.

For each analysis, a symmetry plane was defined along one vertical edge, and a rectangular void a single nodal division high was positioned directly beneath the location of the loaded rigid anchor plate. Free boundaries were prescribed along one edge and at the base of the void. It was also prescribed that discontinuities could not cross the void. The breakout factor was computed for an anchor embedment ratio of 8 for a range of nodal densities. The results are presented in table 1000 of FIG. 10. FIG. 11 shows the boundary conditions and upper bound slip-line mechanism 1100 for the 128×288 nodal division case. For sake of clarity, only discontinuities with slip displacements $|s_t|>0.00001$ have been plotted in the figure.

The results for all nodal densities demonstrate an improvement on the results of Merifield et al. (2001). While Merifield et al. (2001) do not provide exact values, examination of their approximate curve fitted equations and graphs would indicate that their upper bound solution for $N_{co}$ was above 7.6 and lower bound was below 7.1 for an embedment ratio of 8. It is clear from the visual output that the new procedure gives a much clearer view of the mode of response of the soil than when other methods are used.

(c) Soil Bearing Capacity Problems (i) Frictional Weightless Soil with Surface Surcharge Now consider the bearing capacity of a strip footing acting on a frictional weightless soil with a uniform surcharge pressure q. The bearing pressure at failure may be expressed as $qN_q$, where $N_q$ is referred to as a bearing capacity factor. Exact analytical solutions for $N_q$ have been established as can be appreciated from, for example, Reissner, H. 1924 Zum erddruckproblem, Proc. 1st Int. Conf. Appl. Mech., Delft, pp. 295-311, which is incorporated herein in its entirety for all purposes. Here an embodiment of the present invention was used to determine $N_q$ using various nodal densities; In each case, nodes were laid out on a rectangular grid of aspect ratio 3:1 (length:height). A symmetry plane was defined along one vertical edge and a rigid footing was placed adjacent to this along the top surface of the soil. The footing width was reduced for increasing angles of friction to account for the increasing extent of the failure mechanism. Problems with low, medium and high nodal densities were set up which comprised respectively 48×16, 96×32 and 192×64 divisions between nodes (i.e. 49×17, 97×33 and 193×65 nodes). After filtering out overlapping connections between nodes a total of 210768, 3116344 and 47839456 potential discontinuities were present in these problems. Adaptive nodal refinement was used for all runs although for the 48×16 nodal divisions problem the available memory was sufficient to permit the full initial connectivity problem to be solved. Results are given in the table 1200 of FIG. 12.

It is evident from the table 1200 that reasonable approximations of the bearing pressure were obtained even when a low nodal density was used, and that closer estimates could be obtained when the nodal density was increased (albeit at considerable extra computational cost). It is also clear that, as well as permitting larger problems to be solved in the first place (due to considerably reduced memory requirements), the adaptive nodal connection procedure also permits solutions to small problems to be obtained more quickly. Finally, as expected it was found that the accuracy of the solution degrades with increasing angle of friction. This is at least partly a consequence of the larger extent of the failure mechanism in a soil with a high angle of friction, which means, for example, that the important zone below the footing becomes increasingly sparsely populated with nodes when the nodal density is uniform throughout the problem domain.

Figures 12, 13:
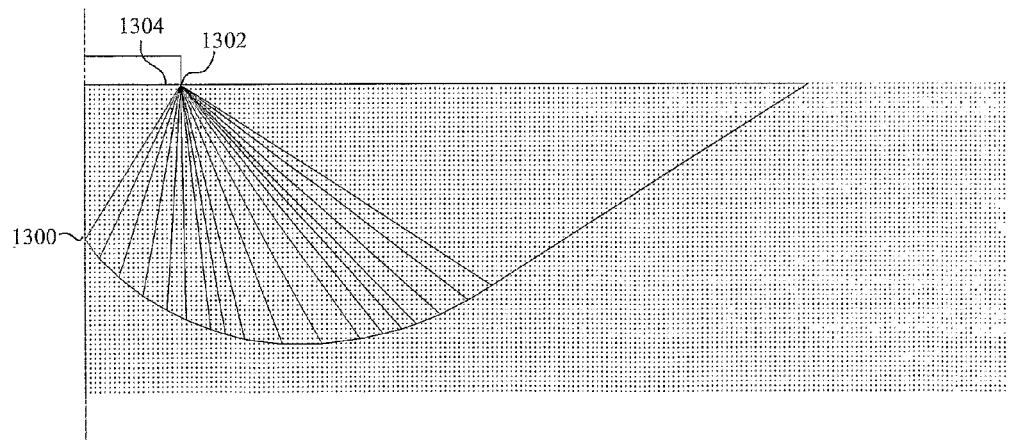
FIG. 12 illustrates a table of variation in bearing capacity factors for a surcharged frictional weightless soil.
FIG. 13 shows a fine grid solution for a soil bearing capacity problem within a frictional weightless soil with a surface surcharge.

FIG. 13 shows a typical solution 1300 to a problem when 192×64 divisions between nodes were specified, in this case when the angle of friction was 25°. For sake of clarity, only discontinuities with slip displacements $|s_i|>0.0001$ have been plotted in the figure. It can be appreciated that the embodiment of the invention clearly identifies a singular point 1302 at the right of a footing base 1304 with lines radiating from this point. One skilled in the art, therefore, can use embodiments of the present invention to automatically identify such singular points. Also as expected discontinuities within the body of different sign meet at an angle of approximately 90±25°, rather than approximately orthogonally, as would be the case when a cohesive (Tresca) material is involved.

(ii) Cohesive-Frictional Soil with Self Weight

Martin, C. 2003 *User Guide for ABC Analysis of Bearing Capacity*. OUEL Report No. 2261/03, version 1.0 edn, University of Oxford, which is incorporated herein by reference in its entirety for all purposes, has recently made available a software program (ABC) that uses the method of stress characteristics to obtain highly accurate solutions specifically for bearing capacity problems. This means that it is now possible to obtain accurate benchmark solutions for practically relevant problems that involve cohesive-frictional soil possessing self weight. For example, consider a 1 m wide strip footing on a soil with cohesion c=5 kPa, angle of friction $\phi$=30° and soil unit weight $\gamma$=20 kN/m³. Assuming a frictionless interface between the footing and soil, the computed ABC limiting footing pressure for this problem is 268.312 kPa (zero surcharge).

Figure 14:
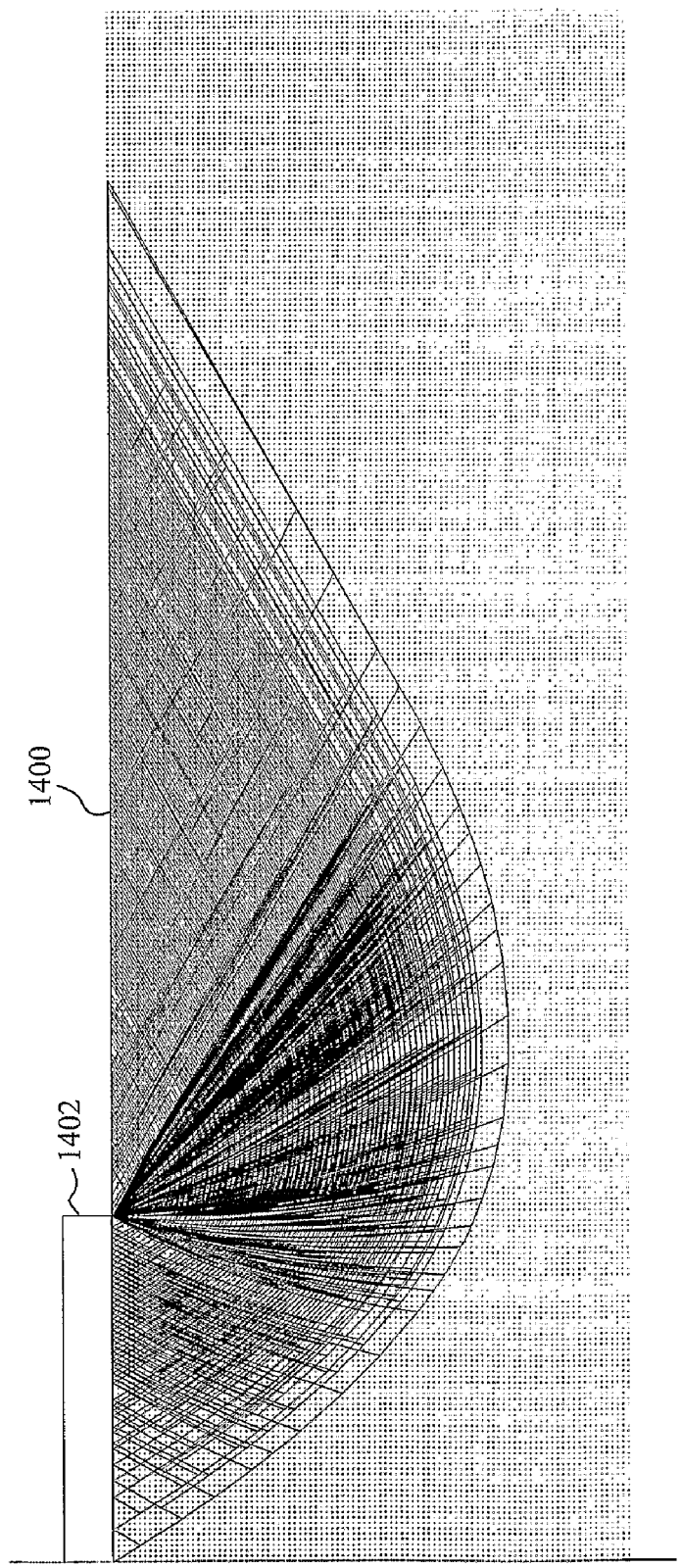
FIG. 14 depicts predicted discontinuities for a soil bearing capacity problem for cohesive-frictional soil with self weight.

A solution 1400 for a cohesive-frictional soil with self weight bearing a footing 1402 obtained using an embodiment of the present invention using 289×97 nodes is given in FIG. 14. For sake of clarity, only discontinuities with slip displacements $|s_i|>0.00001$ have been plotted in the figure. The corresponding computed limiting footing pressure was 269.186 kPa, obtained in 25012 seconds. This is just 0.3% greater than the ABC solution.

(d) Slab Problem

The problem of computing the load factor for a fixed square slab subjected to a uniform out-of-plane pressure loading has already been considered in section B, which described in full the composition of the problem matrices when the slab was discretised using 1×1 nodal divisions. Now consider the same problem but with the slab discretised using 150×150 divisions. Additionally, to reduce computational effort, suppose that a quarter of the slab is now modelled, with symmetry planes defined along a vertical and horizontal edge of the quarter slab.

Figure 15:
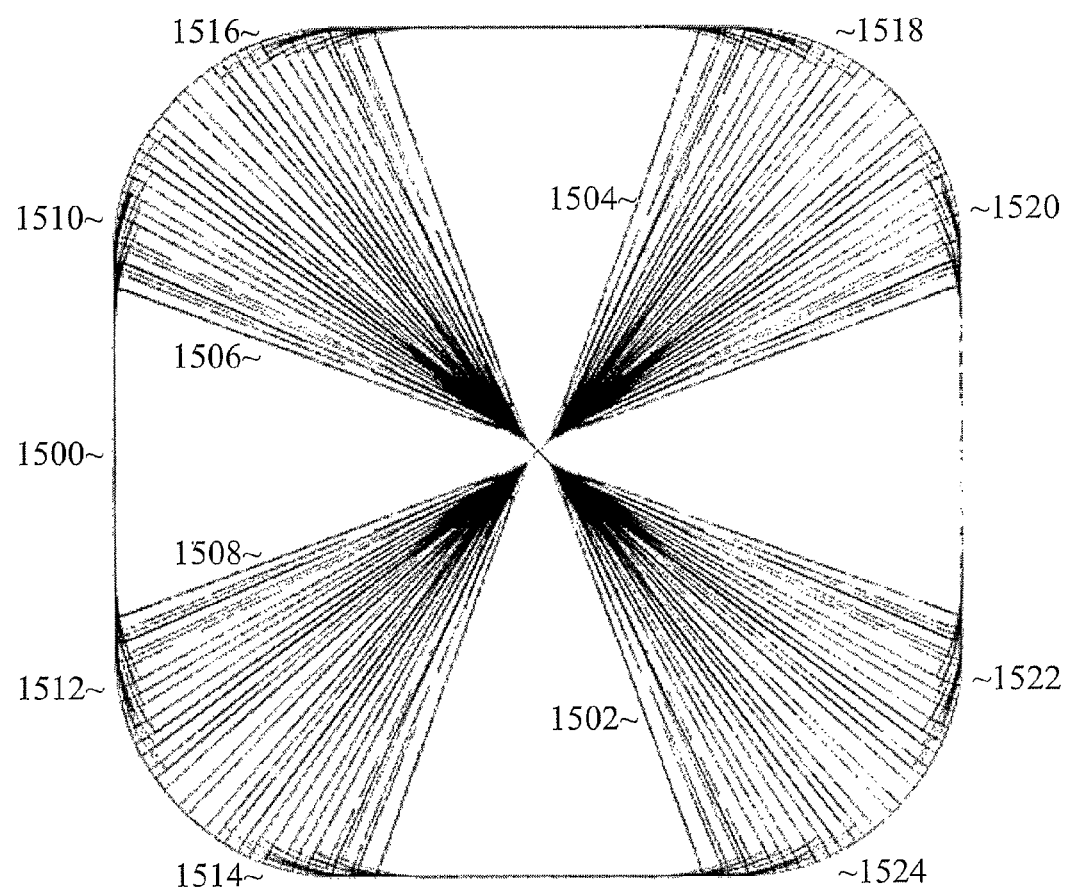
FIG. 15 illustrates computed a yield-line pattern for a uniformly loaded fixed square slab.

FIG. 15 shows the computed layout of yield lines 1500 arising from uniformly loading the slab. Here the computed quarter slab layout has been reflected about the symmetry lines to give the solution for the whole slab. The yield-lines, therefore, comprise four sets of radially disposed discontinuities 1502 to 1508 and a number of other discontinuities, 1510 to 1524, disposed approximately orthogonally to these. The computed solution (42.869) is extremely close to the known exact solution (42.851). The solution was obtained in 50766 seconds. Note that for this problem, unlike the other problems described, overlapping discontinuities were not filtered out by checking the greatest common divisor. This leads both to increased run times and also to an occasional lack of clarity on the visual output (in FIG. 15 some discontinuities which appear to abruptly end and then start again are in evidence).

A significant advantage of embodiments of the present invention is the way in which the form of hitherto poorly understood failure mechanisms can be readily visualised. For problems of potentially broad interest such as, for example, the embedded horizontal anchor in clay problem, the newly identified layouts can potentially be used to help others to derive new analytical solutions. Alternatively, for more specific practical problems, the very clear visual output for example helps engineers to easily distinguish between rigid and yielding zones.

A further advantageous feature is evident when examining visual output from the case study problems. This output clearly indicates that the method can automatically identify singularities in the problem domain, something which, in contrast, can be difficult when using conventional finite elements for example.

Embodiments of the present invention have been found to be very robust in use and can reliably to determine a critical layout of discontinuities for a specified arrangement of nodes. While the proximity of the numerical solution to the true solution in general remains unknown, performing a nodal density study provides a good indication of the magnitude of any improvement in the solution that can be expected as the spacing between nodes tends towards zero.

Although at least some of the above embodiments have been described with reference to substantially uniformly distributed nodes or grids, embodiments are not limited thereto. Embodiments can be realised in which the nodal density varies, for example, under user control or automatically during the course of the solution procedure, as part of an adaptive nodal refinement scheme (e.g. supplementary nodes could be added in regions where discontinuities were identified at a previous iteration). Since the procedure allows discontinuities to be placed anywhere, nodes delineating the ends of discontinuities may also be placed anywhere. Additionally arbitrary geometries and loading patterns can all readily be treated. For example, when a hole is present it is simply necessary to define appropriate boundary conditions around the perimeter of the hole, adding additional nodes as necessary to help accurately define the shape of the hole. For example if a curved boundary is to be represented, nodes would be placed along that curve at suitable intervals. They are not restricted to a specific grid. Any potential discontinuities that cross a hole or void would be automatically disallowed.

A further aspect of embodiments of the present invention relates to a method of designing a body. The design method comprises subjecting a model of the body to any of the above described embodiments for determining the locations and magnitudes of discontinuities, e.g. slip-lines and/or yield-lines, within the body and determining whether or not the body so subjected would meet at least one design or performance criterion.

Once such a body has been designed or once such a body has been analysed it can be either manufactured or used for the purpose of the analysis. For example, the body under investigation may be an actual or proposed reinforced concrete floor, or any proposed or actual load bearing member, and the investigation may be to determine the amount of reinforcement needed to support a given load. The analysis will predict the location and magnitude of any discontinuities within the concrete floor which will form as a result of the applied load and, thus, determine whether or not such a floor could support such a load. If the analysis shows that such a floor could support such a load, if it already exists, it can be used as such or it can be manufactured in accordance with the results from the model.

Furthermore, embodiments of the present invention can be realised in which an existing body is analysed to identify the discontinuities that might materialise if the body was subjected to a prescribed load. In light of the analysis appropriate action, such as appropriate strengthening of the body can be effected to prevent the identified discontinuities from forming. Suitably, embodiments provide a method for modifying a body comprising the steps of modelling the response of the body to a given load using the above embodiments to identify discontinuities and strengthening the body to address at least one of the discontinuities.

Although the above embodiments have been described with reference to using linear programming to identify the discontinuities, e.g. slip-lines and yield-lines, embodiments are not limited thereto. Embodiments can be realised in which higher order objective functions and constraints are used. For example, quadratic programming can be used to identify discontinuities. Alternatively, or additionally, mathematical programming techniques other than linear or quadratic programming can be used in embodiments of the present invention. Alternatively, or additionally, non-classical optimisation techniques can alternatively be used to minimise the energy dissipated in embodiments of the present invention. One skilled in the art will also appreciate that in some cases it will be prudent to modify aspects of the problem (e.g. parameters not used as variables) during the course of an iterative analysis in order to obtain the most accurate results possible.

The examples given in support of the above embodiments have utilised displacements on discontinuities that were either in-plane translational or out-of-plane rotational, with corresponding in-plane or out-of-plane loading. However, embodiments are not limited thereto. Embodiments can be realised in which displacement sets on any discontinuity can represent any appropriate quantity. For example, embodiments can be realised in which discontinuities represent the intersection between rotating blocks, requiring an increase in the number of displacement variables compared to a case where discontinuities represent the interface between translating blocks only. The purely translating block case can be considered to be a subset of the rotating block case; in the case of the sliding block the centre of rotation is at infinity.

The examples given, illustrating the above embodiments, have been described with reference to determining discontinuities within a plane. However, embodiments are not limited thereto. Embodiments can be realised in which discontinuity surfaces are determined within a volume. For example, rather than using a 2-D discretised representation of a body comprising a plurality of two-dimensionally arranged nodes with discontinuities being modelled as lines between selected nodes, a plurality of three-dimensionally arranged nodes can be used. In this case, rather than considering line-segment discontinuities that interconnect pairs of nodes, facets that each interconnect groups of nodes such as, for example, groups of three nodes, can be considered, with these facets being potential surfaces of discontinuity. Compatibility can be considered along lines where two facets intersect, that is along lines joining appropriate pairs of nodes.

Embodiments of the present invention have advantageously led to the development of a important new analysis procedure, discontinuity layout optimisation (DLO), which has been described above in the context of limit analysis, but is not limited to limit analysis problems only. For example, embodiments of the present invention can be realised within the broader context of mechanics problems involving minimisation of energy dissipation.

It will be appreciated that embodiments of the present invention can be realised in the form of hardware, software or a combination of hardware and software. Any such software may be stored in the form of volatile or non-volatile storage such as, for example, a storage device like a ROM, whether erasable or rewritable or not, or in the form of memory such as, for example, RAM, memory chips, device or integrated circuits or on an optically or magnetically readable medium such as, for example, a CD, DVD, magnetic disk or magnetic tape. It will be appreciated that the storage devices and storage media are embodiments of machine-readable storage that are suitable for storing a program or programs that, when executed, implement embodiments of the present invention. Accordingly, embodiments provide a program comprising code for implementing a system or method as described herein. Embodiments also provide machine readable storage storing such a program. Any such software can be executed on a suitably programmed computer.

The invention claimed is:

1. A method of manufacturing a body; the method comprising the steps of modelling the body as a plurality of n nodes associated with m potential discontinuities, between a selected number of the n nodes, within the body;

determining, from the potential discontinuities, an optimised set of discontinuities that leads to optimisation of an objective function which quantifies the energy dissipation within the body due to displacements at the potential discontinuities in response to a given action; the objective function is expressed in terms of the potential discontinuities and work associated with respective displacements at the potential discontinuities, the objective function being subject to at least one constraint expressing a relationship between the potential discontinuities and respective components of displacements at the nodes associated with the potential discontinuities; and materially producing the body as modelled.

2. A method as claimed in claim 1, in which the step of modelling the body as a plurality of nodes associated with potential discontinuities within the body comprises establishing a set, d, of displacements associated with the m potential discontinuities.

3. A method as claimed in claim 2 wherein the set, d, of displacements associated with the m potential discontinuities comprises $\eta$ displacement variables associated with each discontinuity such that d is a vector of size $\eta m$.

4. A method as claimed in claim 1 comprising establishing a set p of plastic multipliers associated with the m potential discontinuities representing the work associated with respective displacements at the potential discontinuities.

5. A method as claimed in claim 4, wherein there are $\pi$ displacement variables associated with each potential discontinuity such that the set of plastic multipliers, p, is a vector of size $\pi$m.

6. A method as claimed in claim 1 comprising establishing a set g where g is a vector of size $\pi$m such that terms in g represent the work done for each unit displacement at the potential discontinuities.

7. A method as claimed in claim 1 in which the step of determining the optimised set of discontinuities comprises minimising the energy dissipation due to displacements at the potential discontinuities and boundaries.

8. A method as claimed in claim 1 in which the step of determining the optimised set of discontinuities comprises optimising, using mathematical programming or some other suitable optimisation technique, the objective function, min $\lambda f_L^T d = -f_D^T d + g^T p$, subject to constraints, $Bd=0$, $Np-d=0$, $f_L^T d=1$, $p \geq 0$, where $f_D$ and $f_L$ are vectors containing respectively specified dead and live loads, d is a vector of displacements on the discontinuities; g is a vector containing the work done for each unit displacement on each discontinuity, B is a suitable compatibility matrix, N is a suitable flow matrix and p is a vector of plastic multipliers.

9. A method as claimed in claim 8 wherein the displacements in d and, if necessary, the plastic multipliers in p, are the problem variables.

10. A method as claimed in claim 1 in which the potential discontinuities connect nonadjacent nodes of the plurality of nodes.

11. A method as claimed in claim 1 in which the step of modelling the body as a plurality of n nodes associated with m potential discontinuities, between a selected number of the n nodes, within the body comprises adding at least one further node to the n nodes to create at least (n+1) nodes.

12. A method as claimed in claim 1, additionally comprising the step of maximising an applied load factor, $\lambda$, subject to $B^T t + \lambda f_L - q = -f_D$ and $N^T q \leq g$, where B is a suitable compatibility matrix, t represents a vector of equivalent internal nodal actions for all n nodes, where q is a vector of actions acting on the potential discontinuities, $f_L$ and $f_D$ are vectors representing live and dead loads, N is a suitable flow matrix such that t, q and are $\lambda$ the problem variables.

13. A method as claimed in claim 12 in which the internal nodal actions in t are used to determine whether at least one further potential discontinuity should be added to influence the solution represented by the optimised set of discontinuities.

14. A method as claimed in claim 1 in which body forces are expressed in relation to discontinuities, rather than elements.

15. A method of modifying a body; the method comprising the steps of
modelling the body as a plurality of n nodes associated with m potential discontinuities, between a selected number of the n nodes, within the body when subjected to an action;
determining, from the potential discontinuities, an optimised set of discontinuities that leads to optimisation of an objective function which quantifies the energy dissipation within the body due to displacements at the potential discontinuities in response to a given action; the objective function is expressed in terms of the potential discontinuities and work associated with respective displacements at the potential discontinuities, the objective function being subject to at least one constraint expressing a relationship between the potential discontinuities and respective components of displacements at the nodes associated with the potential discontinuities; and
materially modifying the body to be able to withstand the action.

16. A method as claimed in claim 15, in which the step of modelling the body as a plurality of nodes associated with potential discontinuities within the body comprises establishing a set, d, of displacements associated with the m potential discontinuities.

17. A method as claimed in claim 16 wherein the set, d, of displacements associated with the m potential discontinuities comprises η displacement variables associated with each discontinuity such that d is a vector of size ηm.

18. A method as claimed in claim 15 comprising establishing a set p of plastic multipliers associated with the m potential discontinuities representing the work associated with respective displacements at the potential discontinuities.

19. A method as claimed in claim 18, wherein there are $\pi$ displacement variables associated with each potential discontinuity such that the set of plastic multipliers, p, is a vector of size $\pi$m.

20. A method as claimed in claim 15 comprising establishing a set g where g is a vector of size $\pi$m such that terms in g represent the work done for each unit displacement at the potential discontinuities.

21. A method as claimed in claim 15 in which the step of determining the optimised set of discontinuities comprises minimising the energy dissipation due to displacements at the potential discontinuities and boundaries.

22. A method as claimed in claim 15 in which the step of determining the optimised set of discontinuities comprises optimising, using mathematical programming or some other suitable optimisation technique, the objective function, min $\lambda f_L^T d = -f_D^T d + g^T p$, subject to constraints, $Bd=0$, $Np-d=0$, $f_L^T d=1$, $p \geq 0$, where $f_D$ and $f_L$ are vectors containing respectively specified dead and live loads, d is a vector of displacements on the discontinuities; g is a vector containing the work done for each unit displacement on each discontinuity, B is a suitable compatibility matrix, N is a suitable flow matrix and p is a vector of plastic multipliers.

23. A method as claimed in claim 22 wherein the displacements in d and, if necessary, the plastic multipliers in p, are the problem variables.

24. A method as claimed in claim 15 in which the potential discontinuities connect nonadjacent nodes of the plurality of nodes.

25. A method as claimed in claim 15 in which the step of modelling the body as a plurality of n nodes associated with m potential discontinuities, between a selected number of the n nodes, within the body comprises adding at least one further node to the n nodes to create at least (n+1) nodes.

26. A method as claimed in claim 15, additionally comprising the step of maximising an applied load factor, $\lambda$, subject to $B^T t + \lambda f_L - q = -f_D$ and $N^T q \leq g$, where B is a suitable compatibility matrix, t represents a vector of equivalent internal nodal actions for all n nodes, where q is a vector of actions acting on the potential discontinuities, $f_L$ and $f_D$ are vectors representing live and dead loads, N is a suitable flow matrix such that t, q and $\lambda$ are the problem variables.

27. A method as claimed in claim 26 in which the internal nodal actions in t are used to determine whether at least one further potential discontinuity should be added to influence the solution represented by the optimised set of discontinuities.

28. A method as claimed in claim 15 in which body forces are expressed in relation to discontinuities, rather than elements.

29. An apparatus comprising means to implement a method as claimed in claim 15.

30. An apparatus comprising means to implement a method as claimed in claim 1.

31. The method as claimed in claim 1 in which the step of modelling the body as a plurality of n nodes associated with m potential discontinuities, between a selected number of the n nodes, within the body comprises adding at least one further potential discontinuity to the m potential discontinuities to create at least (m+1) discontinuities.

* * * * *